United States Patent
Saito et al.

(10) Patent No.: US 6,710,429 B2
(45) Date of Patent: Mar. 23, 2004

(54) SEMICONDUCTOR DEVICE AND PROCESS FOR PRODUCTION THEREOF

(75) Inventors: Masahiro Saito, Takasaki (JP); Toru Nagamine, Takasaki (JP); Ichio Shimizu, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/881,716

(22) Filed: Jun. 18, 2001

(65) Prior Publication Data

US 2002/0000674 A1 Jan. 3, 2002

(30) Foreign Application Priority Data

Jun. 30, 2000 (JP) .......................................... 2000-203057

(51) Int. Cl.[7] ............................................. H01L 23/495
(52) U.S. Cl. ...................... 257/666; 257/676; 257/787; 257/670
(58) Field of Search ................................. 257/666, 676, 257/694, 670, 787

(56) References Cited

U.S. PATENT DOCUMENTS 5,475,259 A * 12/1995 Kasai et al. ................. 257/692
5,942,794 A    8/1999 Okumura et al. ............ 257/666
5,986,209 A * 11/1999 Tandy ......................... 174/52.4
6,175,150 B1 * 1/2001 Ichikawa et al. ............ 257/676

FOREIGN PATENT DOCUMENTS

JP        10-189830        2/1997

* cited by examiner

Primary Examiner—Luan Thai
(74) Attorney, Agent, or Firm—Reed Smith LLP; Stanley P. Fisher, Esq.; Juan Carlos A. Marquez, Esq.

(57) ABSTRACT

A semiconductor device is provided with outer leads which show themselves in the bottom surface of the resin encapsulated body. This structure eliminates minute chipping and cracking near the resin which has been cut in the vicinity of the end of the outer lead. The semiconductor device is produced in such a way that a push-back-portion is previously arranged between leads of the lead frame and the push-back-portion is pushed down after molding. The resulting semiconductor device has outer leads such that there is no encapsulating resin between outer leads which show themselves in the bottom surface of the resin encapsulated body.

5 Claims, 8 Drawing Sheets

SEMICONDUCTOR DEVICE AND PROCESS FOR PRODUCTION THEREOF

This application claims priority to Japanese Patent Application No. P2000-203057.

BACKGROUND OF THE INVENTION

1. Field of the Invention

The present invention relates to the manufacturing of semiconductor devices, and more particularly, the present invention relates to a semiconductor device of single-side molded type and a method for manufacturing thereof.

2. Description of the Background

A recent trend in the field of packages, particularly those for portable machines and equipment, is toward a reduction in size and weight of the package. Small-sized packages that follow this trend are generally called CSP (chip size package or chip scale package). They are divided into two types—area array type and peripheral type. The former is characterized by external terminals arranged in a grid pattern on the package surface, whereas the latter is characterized by external terminals arranged around the package periphery.

Those of area array type are divided further into FBGA (Fine-pitch Ball Grid Array) and LBGA (Laminate Ball Grid Array), and those of peripheral type are divided further into SON (Small Outline Non-leaded package) and QFN (Quad Flat Non-leaded package). QFN, a typical peripheral type CSP, has an external appearance as disclosed in, for example, Japanese Patent Laid-open No. 189830/1998. It differs from the ordinary QFP (Quad Flat Package) as follows. It is formed by the single-side molding technology for size reduction and thickness reduction. It is constructed such that the outer leads (or external terminals) hardly project outward from the package so that the mounting area is reduced. It has outer leads showing themselves at the package bottom for contact with the printed circuit board (i.e., capable of being seen when viewed from the bottom of the package).

Unfortunately, conventional SON and QFN typically suffer form one or more of the following problems:

(1) In their manufacturing process, outer leads are cut together with encapsulating resin filled in the gap between outer leads. This results in minute chipping and cracking in the vicinity of the cut resin near the forward ends of outer leads. (In the case of SON and QFN, outer leads include those parts of leads whose surface is not covered by the encapsulating resin.) Chips stick to the vicinity of encapsulating resin and drop off due to vibration. Chips falling on the foot print at the time of mounting bring about defective mounting and poor appearance.

(2) Encapsulation is carried out in such a way that the encapsulating resin fills the gap between outer leads. Therefore, even though the outer lead is plated before encapsulation, the plated surface hardly shows itself because the side of the outer lead is buried in the encapsulating resin filling the gap between outer leads. Therefore, plating on the side of outer leads does not contribute to wettability and contact at the time of mounting.

(3) After encapsulation, outer leads are cut together with the encapsulating resin filling the gap between leads. Therefore, no plating exists on the cut ends of the outer leads even though the outer leads have been plated before encapsulation. It follows that the cut ends do not contribute to wettability and contact at the time of mounting.

The present invention preferably provides a semiconductor device and a method for manufacturing thereof in which the above-mentioned problems (1) and (2) are addressed in one or more embodiments. The present invention preferably also provides a semiconductor device and a method for manufacturing thereof in which the above-mentioned problems (1) to (3) are addressed in one or more embodiments.

The above and other objects, features, and advantages of the present invention will become readily apparent from the following detailed description which is to be read in connection with the accompanying drawings, abstract, and attached claims.

SUMMARY OF THE INVENTION

In one aspect of the present invention, there is provided a semiconductor device having a plurality of leads and a resin encapsulated body surrounded by a first surface, a second surface, and four side surfaces through which the ends of said leads show themselves (i.e., the ends may be viewed or contacted from the side of the package). The first surface may be an upper or top surface, and the second surface may be a lower or bottom surface. This embodiment is preferably characterized in that said leads project outward from the resin encapsulated body through the second surface (leads viewable from the bottom), between the first and the second surfaces (leads viewable from the side), and show themselves in the first surface of the resin encapsulated body (leads viewable from above the package). Said leads preferably project such that the side of the projecting part shows itself.

In the above-mentioned aspect, the leads project outwards from the resin encapsulated body through the second surface between the first and second surfaces. This offers the advantage that leads arranged along one side can be collectively pressed at the time of lead cutting, and hence they can be cut off easily at one time.

Another advantage is that the leads show themselves in the first surface of the resin encapsulated body. Specifically, the leads preferably extend outwards from the sides of the package in way that, when viewed from outside the first surface (viewed from above), the leads may be seen. This leads to a much smaller mounting area required for contact with the printed circuit board when compared to a conventional semiconductor device (such as QFP) in which the leads project from the resin encapsulated body, and hence the leads have to be bent. This in turn leads to improved mounting density.

Another potential advantage of one or more embodiments of the present invention is that the side of the projecting part (lead) shows itself. This eliminates the possibility that minute chipping and cracking occurs when resin is cut in the vicinity of the lead end. The fact that there is no resin on the side of the lead permits improved contact between the leads and the terminals on the printed circuit board. It also facilitates visual inspection. In the case of plated leads, the plated surface shows itself, thereby improving the wettability of the lead and also improving contact at the time of mounting.

Another aspect of the present invention is characterized by a semiconductor device having a plurality of leads and a resin encapsulated body surrounded by a first surface, a second surface, and four side surfaces through which the ends of said leads show themselves. This embodiment is preferably further characterized in that said leads project outwards from the resin encapsulated body through the second surface and between the first and the second surfaces, with the end surface of said projecting part being coated with a metal layer (e.g., plated). The leads again may show themselves in the first surface of the resin encapsulated body, and said leads project such that the side of the projecting part shows itself.

The second aspect may be similar to the first aspect in that said leads project outwards from the resin encapsulated body through the second surface between the first and the second surfaces and show themselves in the first surface of the resin encapsulated body, and said leads project such that the side of the projecting part shows itself. The second aspect is characterized in that the end surface of said projecting part is coated or plated with a metal layer.

In the ordinary process of manufacturing semiconductor devices, leads are cut after the lead frame has been coated with a metal layer by plating or the like. After the leads have been cut, the metal layer does not remain on the end surface of the projecting part. According to at least one embodiment of the present invention, however, a hole is previously made in each lead of the lead frame (which is not yet cut) such that the end surface of the lead shows itself. This permits the end surface of the lead to be coated with a metal surface. Coating the end surface of the lead was impossible to perform on the conventional semiconductor device in which the space between leads is filled with resin. In this way it may be possible to make the cut surface to contribute to contact with the printed circuit board. The result is improved lead wettability and improved electrical contact at the time of mounting.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

The semiconductor device in one presently preferred embodiment of the invention is characterized by lead frames that are preferably plated entirely with palladium. It differs from the conventional QFN in that it has exposed leads on its bottom such that the gap between leads is not filled with resin. The semiconductor device in this exemplary embodiment is a 16-pin small-sized package measuring approximately 3 mm square. This semiconductor device is mounted by connecting to the electrodes on a printed circuit board which are larger than the exposed leads on the bottom of the resin encapsulated body 1. A description is made below of a semiconductor device according to a presently preferred embodiment of the invention.

Figure 1:
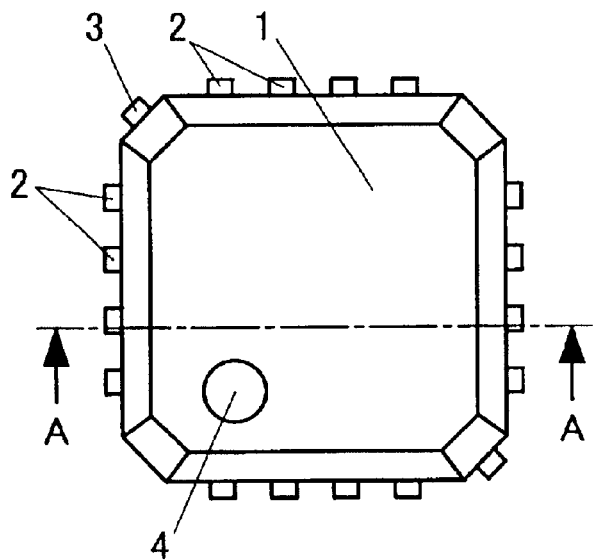
FIG. 1 is a top view of a semiconductor device.

FIG. 1 is a top view of a semiconductor device in accord with a presently preferred embodiment. The resin encapsulated body 1 measures 3 mm square and may include a label 4. Leads 2 project about 0.1 mm from the side of the resin encapsulated body 1. Therefore, the overall size of the semiconductor device (with leads 2 added to the resin encapsulated body 1) is about 3.2 mm square. Leads 2 are arranged at intervals (pitch) of approximately 0.5 mm. Hang leads 3 project from the chamfered parts of the resin encapsulated body 1 in the same way as leads 2. The size of the chamfered part and the length of the projected part of the hang lead depend on the number of pins. The semiconductor device in this exemplary embodiment has two hang leads 3. Unlike the ordinary QFP which is typically hung by four tabs, the semiconductor device in this embodiment, which is smaller in package size, has a small chip and a small tab accordingly. Because of the small tab, the hang lead is comparatively thicker and wider. Consequently, two hang leads are preferably enough to ensure sufficient strength. Reducing the number of hang leads increases the space for leads 2.

Figure 2:
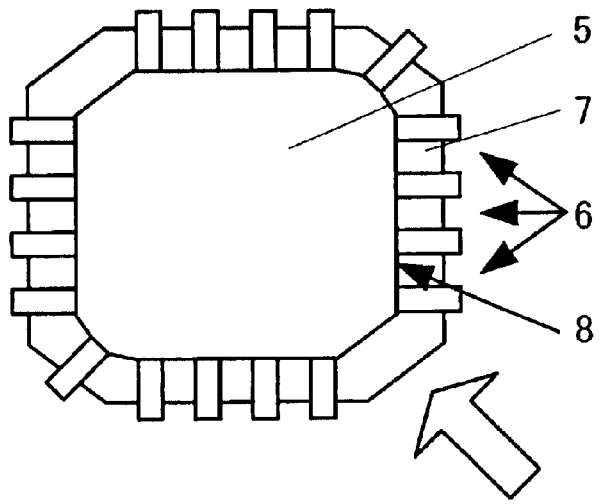
FIG. 2 is a bottom view of a semiconductor device.
Figure 3:
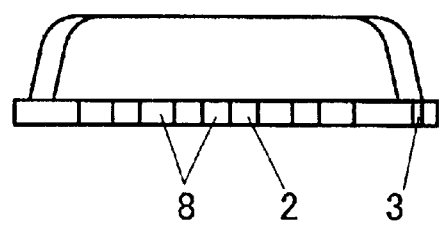
FIG. 3 is a side view of a semiconductor device.

FIG. 2 is a bottom view of the semiconductor device in this embodiment. FIG. 3 is a side view of the semiconductor device in this embodiment. Leads 2 can be seen at the package bottom 5. The side of each lead shows itself in the lead pocket 6. The lead pocket 6 is comprised of the side surface of two adjacent leads 2, that surface of the encapsulating resin which shows itself between leads, and the surface 8 at which the encapsulating resin comes into contact with the forward end of the push-back-portion. Exemplary dimensions are as follows. The width of the lead pocket 6 is 0.26 mm, which is about one half of the lead pitch (0.5 mm). The length of the lead pocket 6 is 0.125 mm (measured inward from the outer line of the resin encapsulated body 1, excluding the projecting lead part).

There is a pocket between the lead 2 and the hang lead 3 and there is also a pocket between a lead at the end of one side and a lead at the end of its adjacent side. The dimensions of these pockets are not specifically restricted so long as they permit the hang lead 3 to function satisfactorily. The width of the hang lead 3 in this exemplary embodiment is 0.18 mm, which is narrower than the width (0.20 mm) of the part enclosed in the resin encapsulated body. This structure is intended to absorb flexural stress that occurs when the tab is raised. The length of the exposed part is about 0.20 mm, which is approximately equal to the length of the exposed part of the lead 2.

Figure 4:
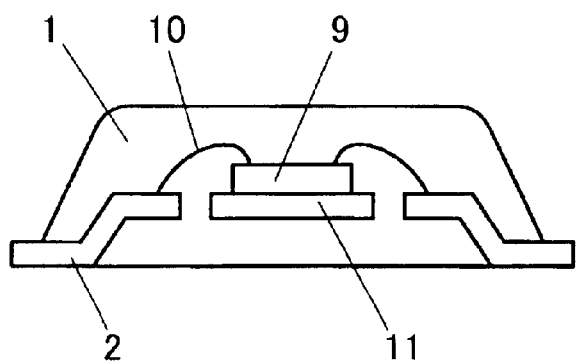
FIG. 4 is a sectional view taken along the line A—A in FIG. 1.

FIG. 4 is a sectional view taken along the line A—A in FIG. 1. The tab 11 is raised to a height of 0.115 mm, such that the space under the tab may be filled with a resin and the semiconductor chip 9 (including the tab 11) is completely encapsulated in a resin. The tab height is preferably at least 0.10 mm to ensure firm adhesion between the tab and the resin. In the case where heat dissipation is necessary, the tab 11 may not be completely sealed with a resin. Instead, the back (lower) side of the tab 11 may be left uncovered and brought into contact with the printed circuit board to improve heat dissipation. The FIG. 4 embodiment preferably has no serious problem with heat generation by the semiconductor chip.

In the semiconductor device of this exemplary embodiment, the size of the semiconductor chip 9 is 0.1 mm square. The lead 2 is bent in conformity (approximately equal height to allow for connection) with the raised tab. The bent part of the lead 2 is preferably about 0.15 mm long. In this embodiment, it is assumed that the tab is larger than the semiconductor chip. However, there may be an instance where the tab is smaller than the semiconductor chip or the tab is as narrow as the hang lead.

Figure 5:
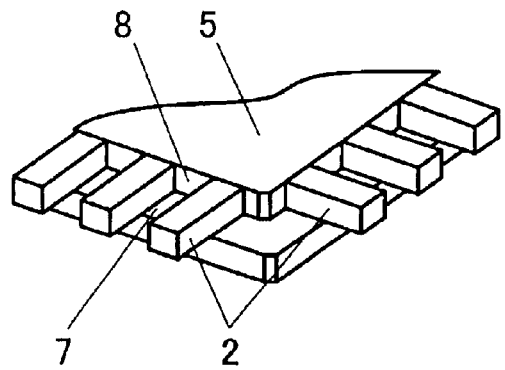
FIG. 5 is an enlarged perspective view of a semiconductor device.

FIG. 5 is an enlarged perspective view of a presently preferred semiconductor device. It shows the shape of lead 2, the shape of lead pocket 6, that surface 7 of the resin encapsulated body which shows itself between leads, and that surface 8 of the resin encapsulated body which comes into contact with the forward end of the push-back-portion. FIG. 5 also shows the exposed side surfaces of the leads 2 and the ability for the leads to be seen from both above and below the chip package.

Figure 6:
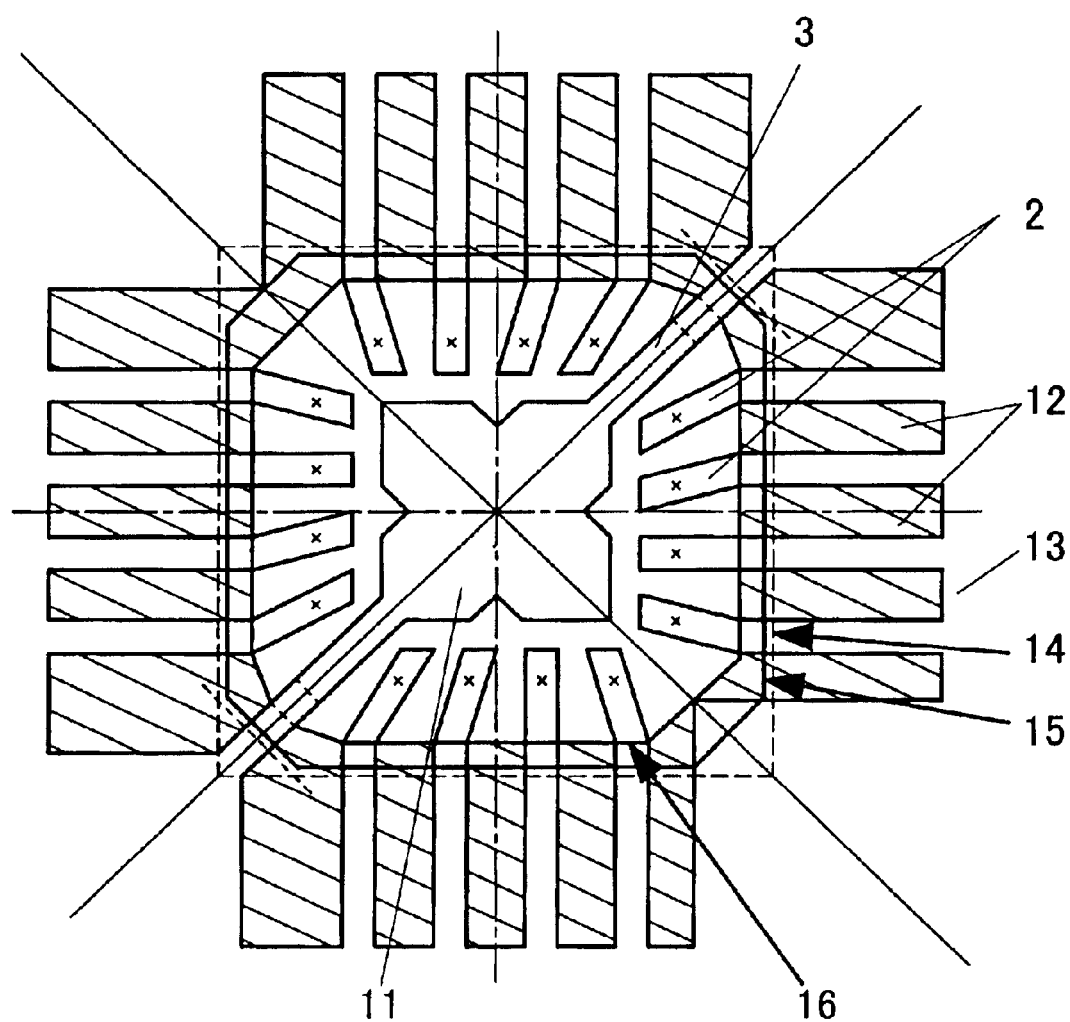
FIG. 6 is a diagram showing a lead frame used for a semiconductor device.

FIG. 6 is a pattern of the lead frame (for one package) used for the semiconductor device in this exemplary embodiment. The thickness of the lead frame 13 is 0.20 mm, the length of the longest side of the tab 11 is 1.4–1.5 mm, and the length of the bent part (to raise the tab) of the hang lead is about 0.15 mm. The height of the raised tab is as mentioned above. Between two adjacent leads 2 and between lead 2 and hang lead 3, there is preferably a push-back-portion 12 (indicated by crosshatch shading in FIG. 6). In the lead frame 13, the push-back-portion 12 does not extend beyond the line from which the leads project outward. In other words, it does not reach the tab 11. This object is accomplished by punching or etching the lead frame 13.

There is a cut between each lead 2 and each push-back-portion 12, so that each push-back-portion 12 is connected to the lead frame 13 as if it is cantilevered. The semiconductor device is preferably produced in the following manner. First, the lead frame is plated with palladium. The tab and leads are raised. The semiconductor chip 9 is attached to the tab 11 with a die bonding material. The semiconductor chip 9 is electrically connected through wires 10 to the leads 2 by wire bonding. (In this embodiment, gold wire is used for wire bonding.) Finally, one-side laminate molding is carried out.

Figure 7:
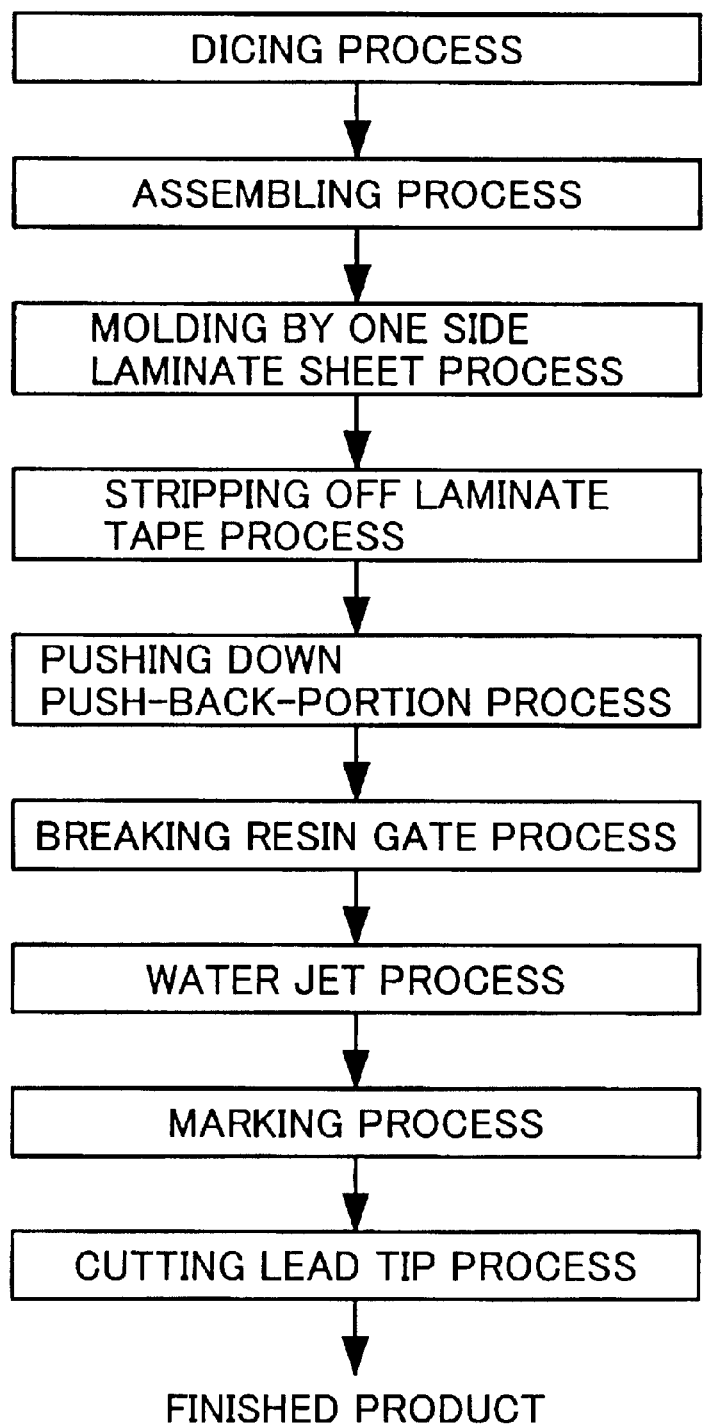
FIG. 7 is a flow diagram for production of a semiconductor device.

FIG. 7 is a basic flow sheet for the semiconductor device. In this flow sheet, the steps up to the one-side laminate molding are collectively called an assembling step. This molding step is important in production of the semiconductor device in this embodiment. It should be noted that the process of manufacturing ordinary semiconductor devices such as QFP does not include the one-side laminate molding step and the laminate tape peeling step. Although the process of manufacturing semiconductor devices such as QFN includes the one-side laminate molding step, it does not include the step of pushing down the push-back-portion. The gate cutting step is intended to cut and remove the resin existing between the gate and the cavity. The water jet step is intended to wash out unnecessary burrs and resin chips from the resin encapsulated body. The one-side laminate molding step used in this embodiment may be replaced by any other step that is capable of molding one side only.

Figure 8:
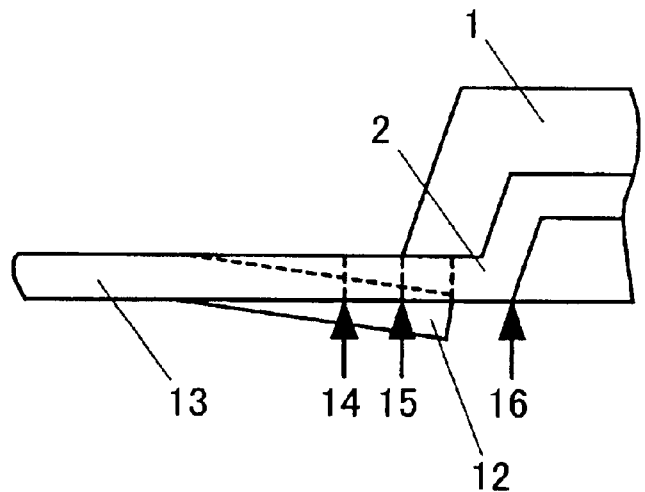
FIG. 8 is a sectional view showing a semiconductor device in the step of pushing down the push-back-portion.

FIG. 8 is a sectional view of the semiconductor device in the step of pushing down the push-back-portion. In the one-side laminate molding step, the push-back-portion 12 present between the leads 2 prevents the space between leads from being filled with the resin. In the ordinary one-side laminate molding step to encapsulate the comb-like lead frame 13, the space between leads 2 is filled with resin because there is no push-back-portion 12 between leads 2. The laminate tape peeling step that follows is intended to peel off the laminate tape.

Figure 9:
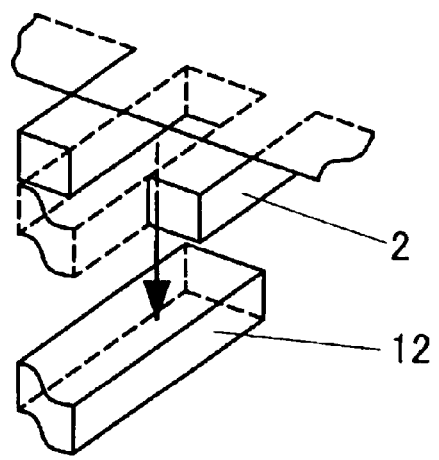
FIG. 9 is an enlarged perspective view showing the push-back-portion being pushed down.

In a subsequent step, the push-back-portion 12 is pushed down (see FIG. 9). The push-back-portions 12 are arranged like a comb in the lead frame 13. The root of the push-back-portion is fixed (cantilevered) to the lead frame. "Pushing down" means any action to separate the push-back-portion 12 from the lead 2. (In this embodiment, the thickness of the lead frame 13 is about 0.2 mm.) It is not always necessary that the push-back-portion 12 is completely separated from the lead 2 in this step, so long as the push-back-portion 12 is completely separated from the lead 2 in the subsequent lead-cutting step. The tip of the lead is cut along the lead-cutting line 14 shown in FIG. 6. The lead-cutting line 14 is also shown in FIG. 8. It is approximately 0.1 mm away outward from the periphery of the resin encapsulated body 1. The position of the lead-cutting line may be changed within the range between the periphery of the resin encapsulated body 1 and the joint between the push-back-portion 12 and the lead frame 13, if there is no possibility that the lead frame 13 is distorted in the push-down step.

The above-mentioned lead cutting step is carried out such that the lead 2 and the push-back-portion 12 are cut simultaneously. This step may be modified as follows because it is not always necessary to cut the push-back-portion 12 in the lead cutting step. That is, it is permissible to bend (or push down) the push-back-portion 12 such that the bent end is outside the lead cutting line 14. This contributes to the life of the blade used in the lead cutting step.

The above-mentioned embodiments include the step of cutting the forward end of the lead 2. This step is not necessary in the case where the lead end is previously prepared. In that case, the lead is cut along the line corresponding to the above-mentioned lead-cutting line 14. Therefore, the push-back-portion 12 is cut along a line which is slightly outside the lead-cutting line.

Figure 10:
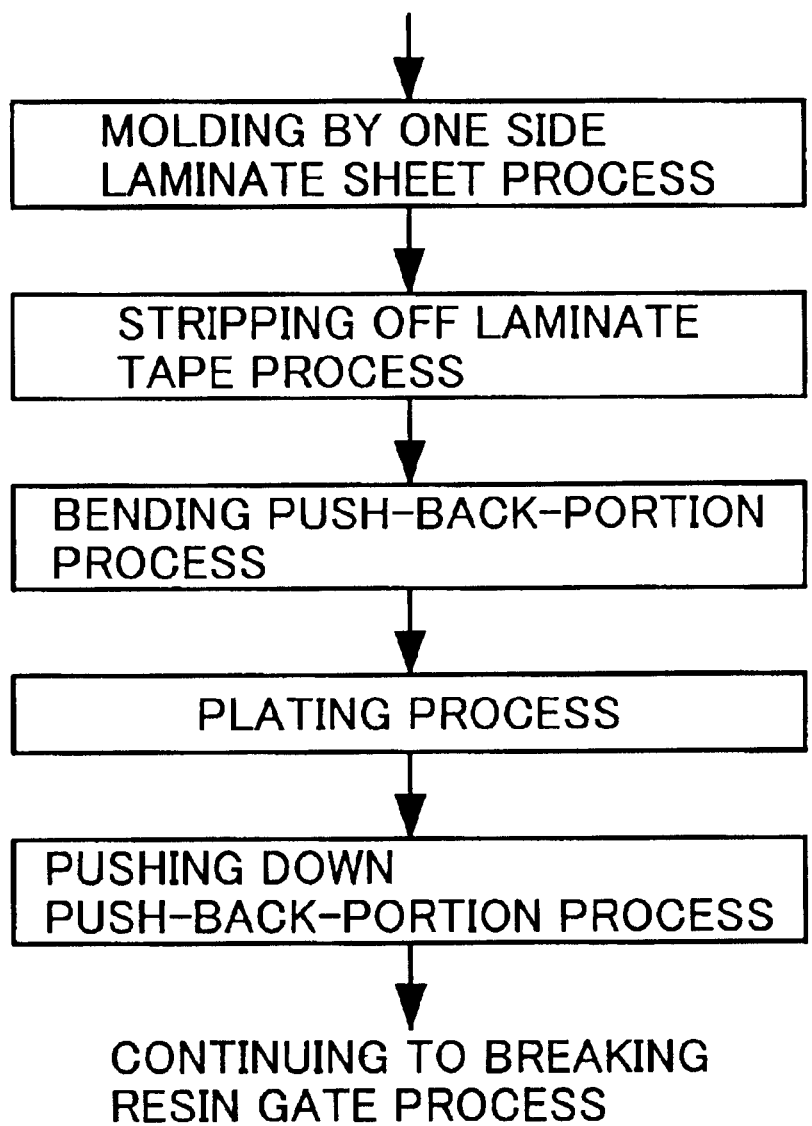
FIG. 10 is a flow diagram of production of a semiconductor device.

An additional presently preferred embodiment will be explained in the following. It may differ from the above embodiments in that the side of the lead 2 undergoes solder (or other) plating. FIG. 10 shows the flow sheet for the semiconductor device in this embodiment. The flow sheet includes major steps after the assembling step up to the gate cutting step. The flow sheet in FIG. 10 differs from that in FIG. 7 in that there are steps of bending the push-back-portion and performing solder (or other) plating between the step of peeling off the laminate tape and the step of pushing down the push-back-portion.

In the step of bending the push-back-portion, the push-back-portion 12 is bent so that the side of the lead 2 is exposed to the plating solution in the step of solder plating. The amount of bending should be such that the side of the lead 2 is sufficiently exposed. In this embodiment, the lead is preferably thicker than 0.2 mm. The solder plating may be accomplished by electroless plating (plating methods other than electroplating) or by any other plating method. The solder used for plating may be, for example, Sn—Pb solder or lead-free solder such as Sn—Ag and Sn—Ag—Si.

Figure 11:
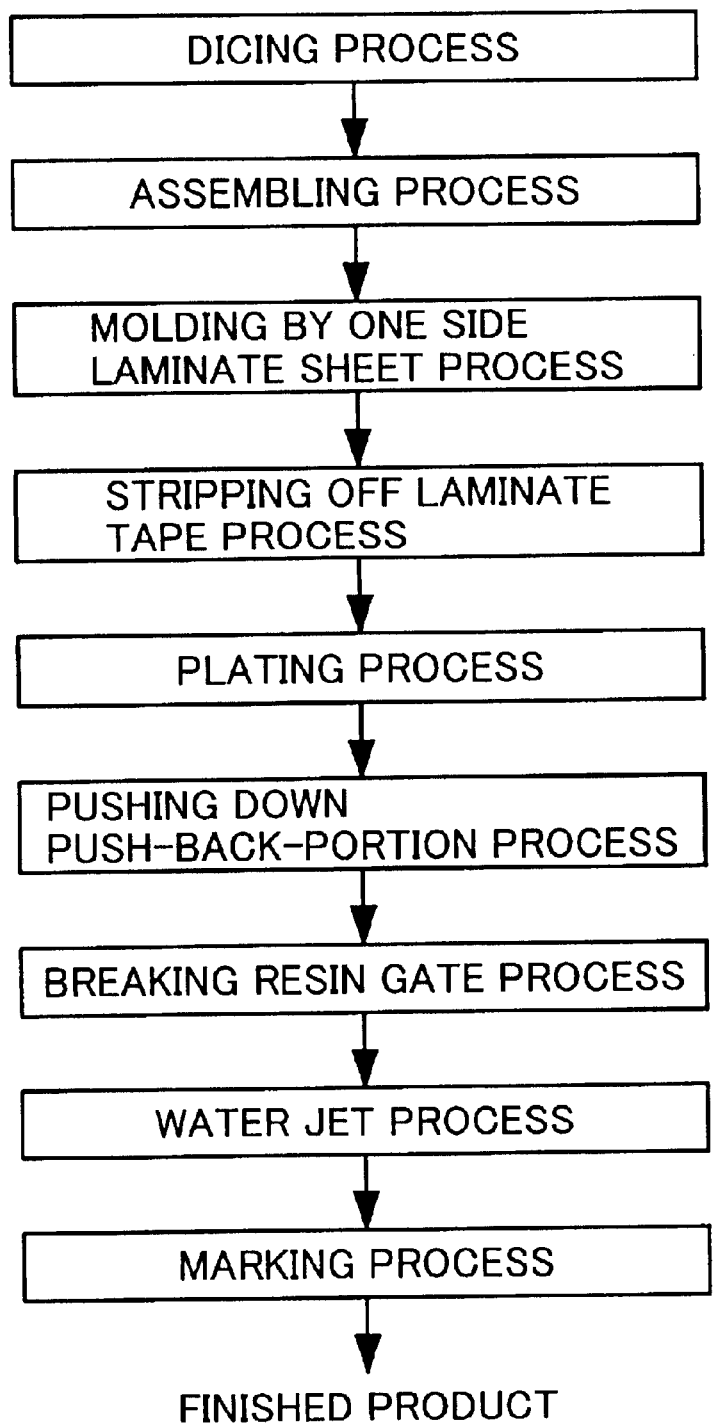
FIG. 11 is a flow diagram of production of a semiconductor device.

Another embodiment will be explained in the following. This embodiment preferably differs from the prviodiment embodiments in that the forward end of the lead 2 is plated. FIG. 11 is the flow sheet of the semiconductor device in this third embodiment. This flow sheet differs from that in FIG. 7 in that solder plating is carried out between the step of peeling off the laminate tape and the step of pushing down the push-back material.

Figure 12:
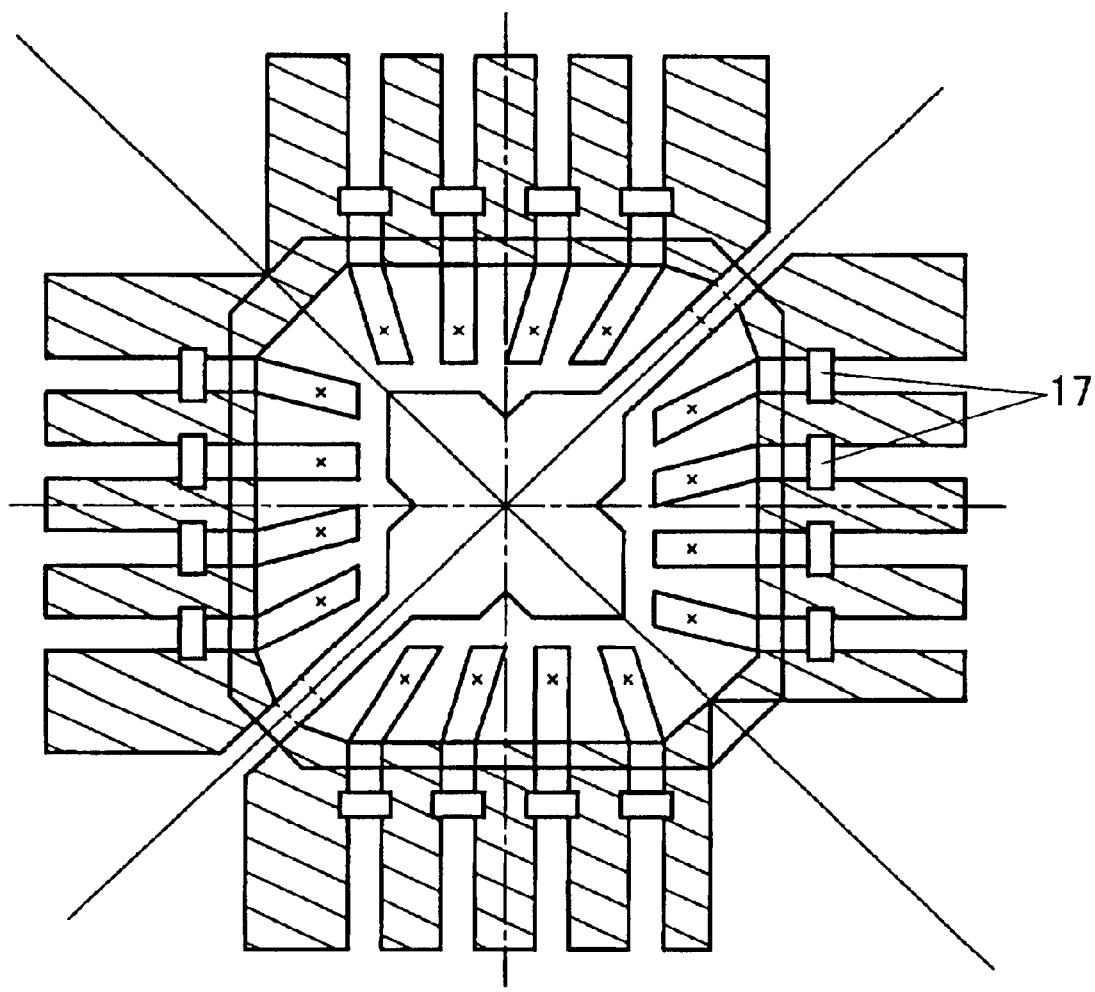
FIG. 12 is a diagram showing the lead frame used for a semiconductor device.

The lead frame used in this embodiment differs from that used in the above embodiments, as shown in FIG. 12. The lead frame shown in FIG. 12 differs from that shown in FIG. 6 in that there is a plating hole 17 at the end of each lead 2. The plating hole 17 is preferably positioned approximately 0.1 mm away from the periphery of the resin encapsulated body. Therefore, this embodiment does not include the step of cutting the end of the lead. According to the conventional process, the lead end cannot be plated after the lead has been cut off. However, the plating hole 17 which is previously provided at the lead end permits the plated lead end to be exposed after resin encapsulation. Moreover, this embodiment makes it possible to omit the step of cutting off the lead end. This leads to cost reduction.

The combination of the second and third embodiments (which will increase the number of steps) gives a semiconductor in which the sides and ends of the leads 2 are plated. Because of the plating on the sides and ends of the lead 2, the resulting semiconductor has improved mounting contact when compared to a semiconductor without such plating.

The foregoing description is based mainly on the application of the present invention to QFN and its production. The present invention is not limited to QFN and its production, but it may be applied to such semiconductor devices as SON in which resin encapsulation is carried out by one-side molding in such a way that leads are exposed.

As mentioned above in this specification, the various presently preferred embodiments of the invention preferably produce one or more of the following effects. The resin encapsulated body may be free from minute chipping and cracking in the vicinity where the end of the outer lead is cut off. Encapsulation may be carried out such that the space between outer leads is not filled with resin. This makes it easier to visually inspect to see if the semiconductor device is in normal contact with the printed circuit board. Thus the semiconductor device has improved contact with the printed circuit board. It is possible to plate the end of the outer lead which contributes to improved contact with the printed circuit board.

Nothing in the above description is meant to limit the present invention to any specific materials, geometry, or orientation of elements. Many part/orientation substitutions are contemplated within the scope of the present invention and will be apparent to those skilled in the art. The embodiments and exact dimensions described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor device, comprising:
   a plurality of leads having a top surface, a bottom surface, two side surfaces, and two end surfaces, said leads having a square cross section shape perpendicular to the longitudinal direction of the leads;
   a resin encapsulated body having a first surface, a second surface opposite said first surface, and four side surfaces through which said leads project,
   each of said leads comprises a first area wherein all of said top surface, bottom surface, and two side surfaces are covered by said resin encapsulated body, a second area wherein said top surface is covered by said resin encapsulated body and said bottom surface and said two side surfaces are exposed from said resin encapsulated body, and a third area wherein said top surface, bottom surface, two side surfaces, and two end surfaces are exposed from said resin encapsulated body.

2. The semiconductor device of claim 1, wherein said second surface has a smaller area than said first surface.

3. The semiconductor device of claim 2, wherein there are two hand leads.

4. A semiconductor device according to claim 3, wherein each of said hang leads has a top surface, a bottom surface, two side surfaces, and two end surfaces, and comprises a first area wherein all of said top surface, bottom surface, and two side surfaces are covered by said resin encapsulated body, a second area wherein said top surface is covered by said resin encapsulated body and said bottom surface and said two side surfaces are exposed from said resin cncapsulatcd body, and a third area wherein said top surface, bottom surface, two side surfaces, and two end surfaces are exposed from said resin encapsulated body.

5. The semiconductor device of claim 1, wherein the resin encapsulated body contains a tab sealed therein.

* * * * *